(12) United States Patent
Ebata et al.

(10) Patent No.: US 7,087,980 B2
(45) Date of Patent: Aug. 8, 2006

(54) FILM THICKNESS MEASURING MONITOR WAFER

(75) Inventors: Makoto Ebata, Tamano (JP); Fusao Fujita, Tamano (JP); Makoto Saito, Tamano (JP)

(73) Assignees: Mitsui Engineering & Shipbuilding Co., Ltd., Tokyo (JP); Admap Inc., Tamano (JP)

( * ) Notice: Subject to any disclaimer, the term of this patent is extended or adjusted under 35 U.S.C. 154(b) by 41 days.

(21) Appl. No.: 10/468,899

(22) PCT Filed: Mar. 4, 2002

(86) PCT No.: PCT/JP02/01956

§ 371 (c)(1),
(2), (4) Date: Oct. 1, 2003

(87) PCT Pub. No.: WO02/071473

PCT Pub. Date: Sep. 12, 2002

(65) Prior Publication Data

US 2004/0067370 A1    Apr. 8, 2004

(30) Foreign Application Priority Data

Mar. 5, 2001  (JP) ............................. 2001-060367
Feb. 7, 2002  (JP) ............................. 2002-031015

(51) Int. Cl.
*H01L 29/06* (2006.01)

(52) U.S. Cl. ........... 257/586; 257/E21.53; 257/E21.57; 257/E21.567

(58) Field of Classification Search ................. 117/94; 257/E21.53, E21.57, E21.567
See application file for complete search history.

(56) References Cited

U.S. PATENT DOCUMENTS

| 6,150,023 A | 11/2000 | Yasaka et al. ............... 438/408 |
| 6,468,923 B1 * | 10/2002 | Yonehara et al. ........... 438/761 |
| 6,613,676 B1 * | 9/2003 | Yonehara et al. ........... 438/691 |
| 6,656,271 B1 * | 12/2003 | Yonehara et al. ............. 117/94 |

FOREIGN PATENT DOCUMENTS

JP        08316283       * 11/1996

* cited by examiner

*Primary Examiner*—Mai-Huong Tran
(74) *Attorney, Agent, or Firm*—Oliff & Berridge, PLC

(57) ABSTRACT

The object of the present invention is to provide a wafer having a structure of enabling an SiC wafer to be put to practical use as a wafer for monitoring a film thickness. For this purpose, an average surface roughness Ra of at least one surface of the SiC wafer is set to be substantially equivalent to a film thickness of a film to be deposited on an Si wafer to be measured. If several types are available to be deposited on an Si wafer to be measured, a minimum film thickness of the film among the several types is determined as an upper limit value, and the average surface roughness Ra of the film thickness measuring SiC wafer is set less than the upper limit value. More concretely, the surface roughness is set to be about 400 times as large as the average surface roughness of a product Si wafer, Ra being preferably set to be 0.08 μm or less. Accordingly, a hard and chemically resistant film thickness measuring wafer can be practically used as a film thickness monitoring wafer, even if not polished to the level of the product Si wafer, thereby obtaining a film thickness measuring monitor wafer that can be reduced in polishing cost and usable semi-permanently.

4 Claims, 5 Drawing Sheets

FILM THICKNESS MEASURING MONITOR WAFER

This applicaton is a 371 of PCT/JP02/01956 Mar. 04, 2002.

TECHNICAL FIELD

The present invention relates to a monitor wafer, in particular, to a film thickness measuring monitor wafer among monitor wafers, which can be used as a monitor wafer even if a surface of the monitor wafer is not polished to the level of the surface roughness of a product Si wafer.

BACKGROUND ART

In a manufacturing process of a semiconductor device, when performing thermal oxidation processing or CVD deposition processing on an Si wafer to be a product, dummy wafers or monitor wafers are usually mounted on a wafer boat together with the product Si wafers. The dummy wafers are added when the product wafers are still insufficient in a specified number of the wafers, or inserted to make a temperature or a gas flow inside a furnace uniform in the CVD process and the like, and therefore, the dummy wafer can not be a final product. The monitor wafer is processed by completely the same processes as those for the product Si wafer, to monitor a film thickness of a CVD film or the like which is formed on the product Si wafer, and the number of particles in the furnace. Accordingly, especially the product Si wafers and the monitor wafer are placed on a wafer boat together, and thermal oxidation films or CVD films are formed simultaneously on the surfaces of the product wafers and the monitor wafer through predetermined processing.

After completion of the predetermined processing, the film thickness measuring monitor wafer is taken out from the boat. Then, a film thickness of the film formed on the monitor wafer is measured with a film thickness measuring instrument to judge whether or not the measured film thickness is within a spec. If it is within the spec, it can be judged that a film having a film thickness within the spec is formed on the product wafer processed at the same time, so that the product wafer can be transferred to a next process.

Incidentally, as a film thickness measuring monitor wafer described above, conventionally, an Si wafer made of the same material as the product wafer has been usually used. When this Si wafer is used as a film thickness measuring monitor wafer, the film is removed by polishing or etching, or a combination of polishing and etching every time when the film thickness measurement is finished, so as to render it reusable. For instance, in a D-poly deposition process for a six-inch wafer, a D-poly film having a thickness of 1000 Å is formed on the film thickness measuring monitor wafer in one time. Once formed, the D-poly film is removed with $HF+HNO_3+H_2O$ (1:8:12) to use it as a film thickness measuring monitor wafer again. Since the surface becomes rough after repeating this process three or four times, it cannot be used as a film thickness monitor wafer. Besides, after repolishing three or four times repeatedly, since the thickness of the wafer becomes thin due to the polishing, it is easy to be deformed or cracked. Or, it becomes unmeasurable, because of getting rougher of Si surface, which makes the wafer unusable. Accordingly, such a wafer is used as a dummy wafer, not as a monitor wafer, or is scrapped.

Therefore, when the above-described Si wafer is used as a film thickness measuring monitor wafer, it has a problem that it cannot be used anymore as a monitor wafer after several times of usage, which results in a short life as a monitor wafer. From such a point of view, recently, a film thickness measuring monitor wafer made of silicon carbide (SiC) has been noticed by fields concerned. More concretely, the SiC monitor wafer is a disciform silicon carbide film having a film thickness of about 1 mm formed by a CVD method, has many following advantages written below and practical use of the SiC monitor wafer is promoted due to its prominent economical effect.

a) It is excellent in corrosion resistance against nitric acid, hydrofluoric acid, and the like, which makes it easy to remove adherents by etching, and the surface of the monitor wafer itself is not roughened by etching, which makes it possible to use repeatedly for a long time.

b) Since difference in thermal expansion coefficient between SiC and silicon nitride or between SiC and polysilicon is small, a film adhered on a monitor wafer is not easy to be peeled off, which makes it possible to reduce particles remarkably on the way of process.

c) Since it is extremely low in diffusion coefficient of impurities such as heavy metals at high temperatures, there is little apprehension of furnace contamination.

d) Since it is excellent in thermal deformation resistance, it facilitates automatic transfer such as robot transfer.

However, when the above-described SiC wafer is used as a monitor wafer, the same surface roughness as that of a product Si wafer is fundermentally required. Especially for measuring particle, though the same surface roughness as that of an Si wafer is required, it is very difficult to polish the SiC wafer to the same degree as the Si wafer. The polishing is performed by chemical mechanical polishing (CMP) when it is required. At this time, advantageous points of high mechanical strength and strong chemical resistance of the SiC wafer serves reversely as an obstacle to polishing. Therefore, there arises a problem in making it practically usable for using a SiC wafer as a monitor wafer so as to be able to measure particles and a film thickness at the same time.

However, there are two cases of usage for a monitor wafer. One is to measure particles and a film thickness simultaneously, and the other is to measure a film thickness only. The latter also appears in many cases.

When specifications required for a film thickness monitor are considered, it is found that the basic principle of the film thickness measuring method using a film thickness monitor wafer is an application of an interference color measuring method which utilizes a phenomenon that an interference color changes in accordance with change in refractive index or thickness of the film. From this point of views, the inventors reach the conclusion that the film thickness measurement is possible so far as it is a surface to obtain necessary reflection intensity (reflection coefficient) required for the measurement to incident light, and therefore a super mirror-finish surface (Ra=0.0002 μm) which corresponds to Si wafer level smoothness is not necessary.

Needless to say, not only SiC, alumina, quartz, tungsten, molybdenum, and further glassy carbon and sapphire can be cited as a raw material for a monitor wafer for measuring film thickness and the above basic principle can be applied to these materials.

The object of the present invention is to provide a wafer having a structure of enabling a hard wafer such as an SiC material to be put to practical use as a wafer for monitoring a film thickness.

DISCLOSURE OF THE INVENTION

The inventors have obtained knowledge that even if surface roughness of a monitor wafer is not equivalent to surface roughness of a product Si wafer, it is sufficient for the monitor wafer so far as the monitor wafer has surface roughness from which reflection intensity (reflection coefficient) necessary for the measurement can be obtained, and when the monitor wafer is allowed to have surface roughness substantially equivalent to the minimum film thickness for a measurable limit thickness of films to be measured, monitoring of film thickness can be appropriately performed, and have reach the present invention.

More concretely, a film thickness measuring monitor wafer relating to the present invention comprises a wafer having an average surface roughness Ra of at least one surface of the wafer being set to be equivalent or less to a film thickness of a film deposited on an Si wafer to be measured.

Further, a film thickness measuring monitor wafer relating to the present invention comprises a wafer having an average surface roughness Ra of at least one surface of the wafer being able to set to be a close value less than an upper limit value when the minimum film thickness among several types of films deposited on an Si wafer to be measured is taken as the upper limit value Furthermore, a film thickness measuring monitor wafer relating to the present invention comprises a wafer having an upper limit value of the average film roughness of at least one surface of the monitor wafer preferably being set to be about 400 times as large as the average surface roughness of a product Si wafer.

In this case, the average surface roughness of the above-described monitor wafer is preferably set to be 0.08 μm or less, more preferably 0.02 μm or less.

BEST MODE FOR CARRYING OUT THE INVENTION

Hereinafter, a concrete embodiment of the film thickness measuring monitor wafer relating the present invention will be explained in detail with reference to the drawings.

Figure 1:
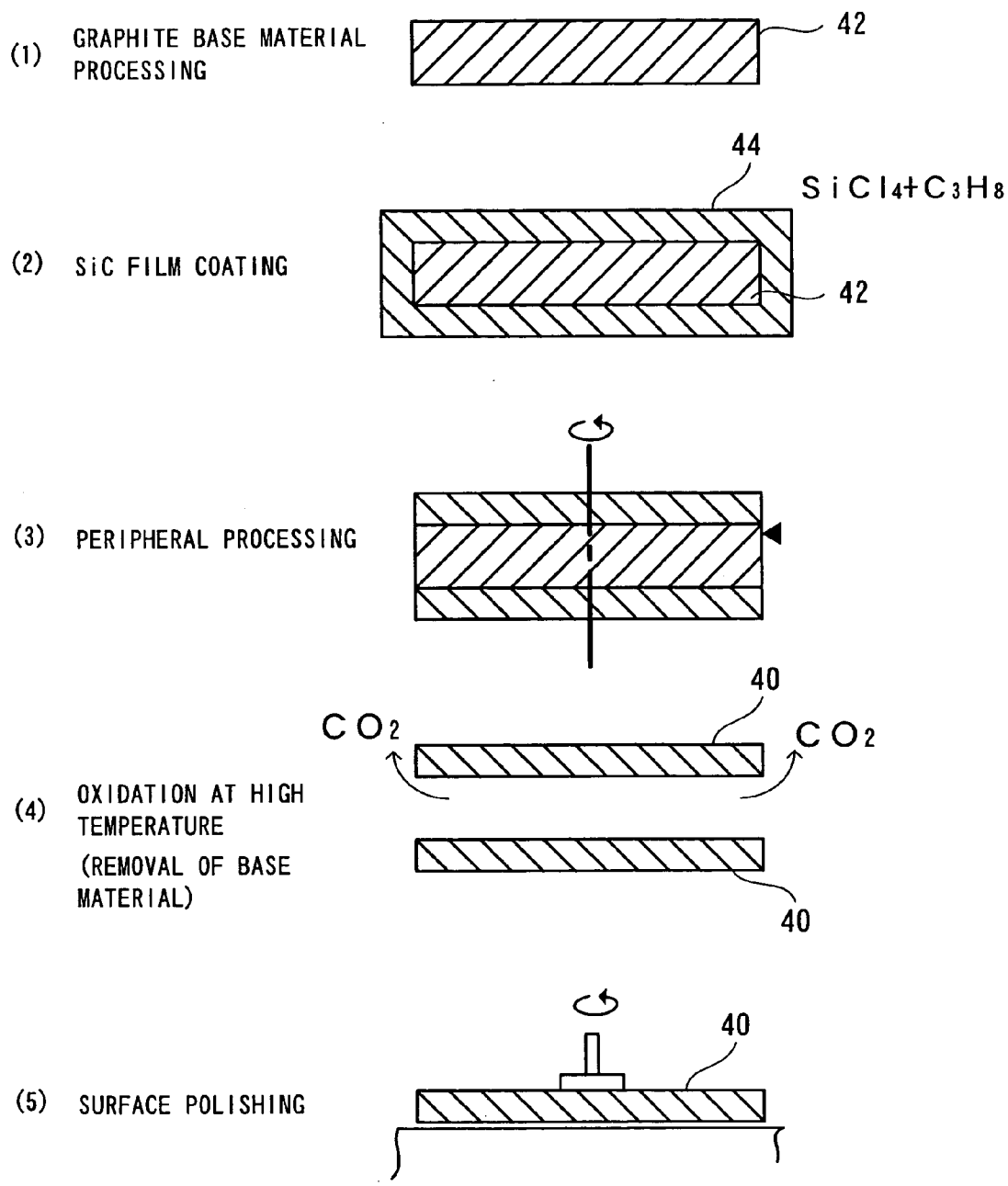
FIG. 1 is a view showing a manufacturing process of an SiC monitor wafer.

FIG. 1 shows an example of a manufacturing process to form a monitor wafer 40 relating to the embodiment using SiC as a material. Among several method for manufacturing a SiC wafer such as calcinations of SiC powders, silicon-carbonization of carbon with Si gas, and the like, this figure shows a manufacturing process by a CVD method. First, a circular graphite base material 42 made of high purity graphite and having a predetermined size is prepared in accordance with the size of an SiC monitor wafer 40 which will be manufactured (FIG. 1(1)).

Then, the circular graphite base material 42 is put in a CVD apparatus and the inside of the apparatus (furnace) is heated to and kept at a predetermined temperature, for instance, 1000 to 1600° C. The inside of the furnace is set to a predetermined pressure, for instance, 100 Torr. Then, $SiCl_4$ and $C_3H_8$ which are raw materials of SiC are supplied to the CVD apparatus in an amount of 5 to 20 vol. % respectively with hydrogen gas ($H_2$) as a carrier gas. As a result, an SiC layer (silicon carbide layer) 44 is deposited on the surface of the graphite base material 42, and this deposition processing is continued till the film thickness comes to 0.1 mm to about 1 mm (FIG. 1(2)).

Thereafter, the graphite base material 42 on the surface of which a film of SiC layer 44 is formed is taken out from the CVD apparatus, and the peripheral surface thereof is removed by a mechanical grinding process so that the peripheral surface of the graphite base material 42 is exposed (FIG. 1(3)). Then, the graphite base material 42 sandwiched by SiC films is put into a furnace at 900 to 1400° C. while supplying oxygen thereto so that two sheets of SiC monitor wafer 40 are obtained by burning to remove the graphite base material 42 under an oxidation atmosphere (FIG. 1(4)). Thereafter, as shown in FIG. 1(5), the SiC monitor wafer 40 is polished and, at the same time, the peripheral edge portions are chamfered.

The monitor wafer is generally surface-polished in the same manner as an ordinary silicon wafer. The SiC monitor wafer 40 is polished by polishing with diamond abrasive grains, and the average surface roughness Ra is set as will be described below.

That is, at least the average surface roughness Ra on one surface of the SiC wafer 40 is set to be substantially equivalent to or smaller than the film thickness of the film deposited on the Si wafer which is an object wafer for the measurement. On the Si wafer, an insulating oxide film, polycrystalline silicon film or the like is deposited so as to have a film thickness of, for instance, 250 Å, 500 Å, 1000 Å or the like. For this monitor having such a film thickness, the surface roughness Ra of the above-described SiC wafer 40 is set to be at least substantially equivalent to or smaller than the thickness to be the minimum film thickness. For instance, when film deposition process is performed to the Si wafer in plural times so as to obtain film thicknesses of 250 Å, 500 Å, and 1000 Å, since the minimum film thickness is 250 Å (=0.025 μm), the average surface roughness Ra given to the SiC wafer 40 is set to be Ra<0.025 μm. Needless to say, when monitoring is performed at every time the Si wafer is singly deposited, for instance, when a D-poly film having a film thickness of 500 Å is deposited, the average surface roughness of the SiC monitor wafer 40 is set to be 500 Å (=0.05 μm) as the upper limit value, and polishing is given so that the average surface roughness Ra is maintained to be less than the upper limit value (Ra<0.05 μm)

The average surface roughness of the product wafer (Si wafer) is Ra≈0.0002 μm, and corresponding to this, the upper limit value of the surface roughness Ra of the SiC monitor wafer 40 may be set to be Ra≈0.08 μm which is 400 times of the average surface roughness of the product wafer.

Even the average surface roughness Ra of the SiC monitor wafer 40 is adjusted in this way, film thickness monitoring can be performed, therefore it becomes unnecessary to perform a polishing work of the SiC wafer which is high in mechanical strength and chemical resistance to about the same degree as that of the Si wafer. Therefore, the SiC wafer can be practically used just as a film thickness monitor. Though Ra≈0.08 μm is set to be the upper limit value, it is needless to say that the surface roughness is desirably as small as possible. Therefore, it is desirable that the upper limit value Ra is set to be 0.02 μm, which is 100 times as much as the average surface roughness of the product wafer. The following is a concrete example in which the Si wafer and the SiC wafer are subjected to film deposition processing respectively, and the SiC wafer is confirmed to be applicable as a film thickness monitor.

EXAMPLE 1

An Si monitor and an SiC monitor are used as a wafer. Polycrystalline silicon is vapor-deposited simultaneously on the Si monitor wafer and the SiC monitor wafer so that different film thickness order of 2000 Å, 1400 Å, and 700 Å can be obtained, and the experiment is carried out for each one batch. The thickness measurement result of the vapor-deposited films is shown in Tables 1 and 2 below. The measurement result is obtained using NanoSpec 8000XSE manufactured by Nanometrix Corp.

TABLE 1

| Si (unit: angstrom) | | | | | |
|---|---|---|---|---|---|
| No. 1 | No. 2 | No. 3 | No. 4 | No. 5 | No. 6 |
| 1998 | 2039 | 2032 | 2052 | 2049 | 2020 |
| 1429 | 1461 | 1466 | 1463 | 1465 | 1450 |
| 693 | 705 | 706 | 707 | 704 | 701 |

TABLE 2

| SiC (unit: angstrom) | | | | | |
|---|---|---|---|---|---|
| No. 1 | No. 2 | No. 3 | No. 4 | No. 5 | No. 6 |
| 2011 | 2035 | 2022 | 2036 | 2027 | 2023 |
| 1435 | 1458 | 1455 | 1460 | 1451 | 1448 |
| 687 | 700 | 701 | 709 | 698 | 703 |

Figure 2:
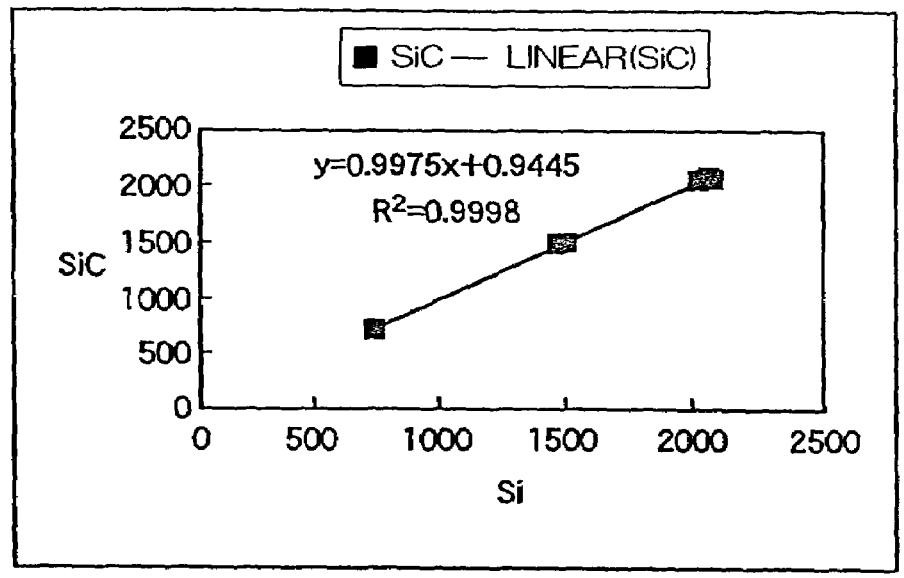
FIG. 2 is a graph showing monitor applicability test results when an Si wafer and an SiC wafer are deposited in different film thicknesses.
Figure 3:
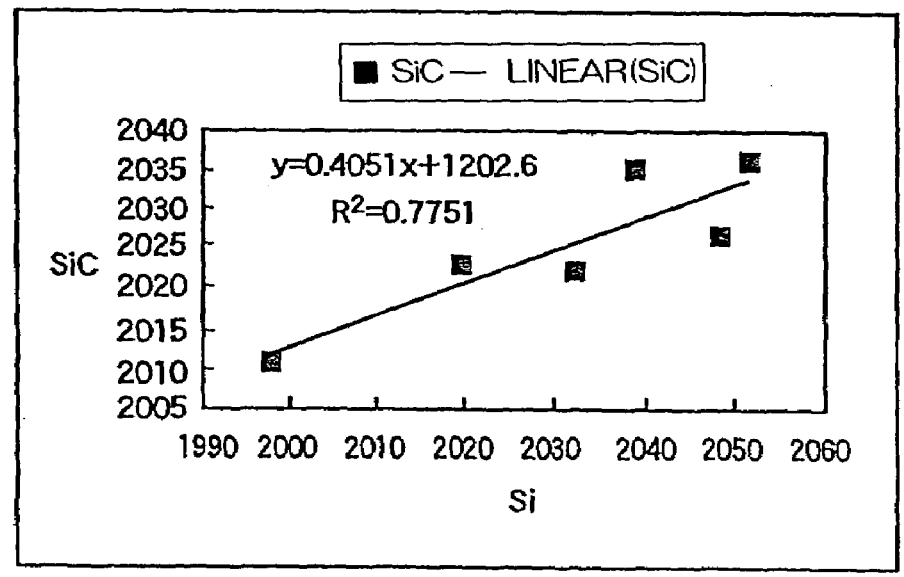
FIG. 3 is a graph showing monitor applicability test results when an Si wafer and an SiC wafer are deposited with polycrystalline silicon in a thick film (about 2300 Å)
Figure 4:
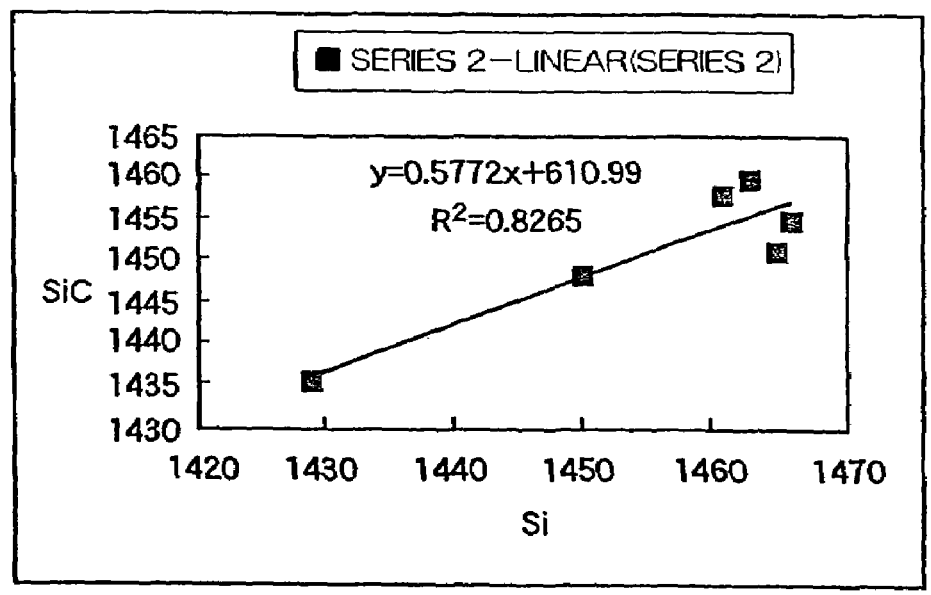
FIG. 4 is a graph showing monitor applicability test results when an Si wafer and an SiC wafer are deposited with polycrystalline silicon in a middle thick film (about 1500 Å)
Figure 5:
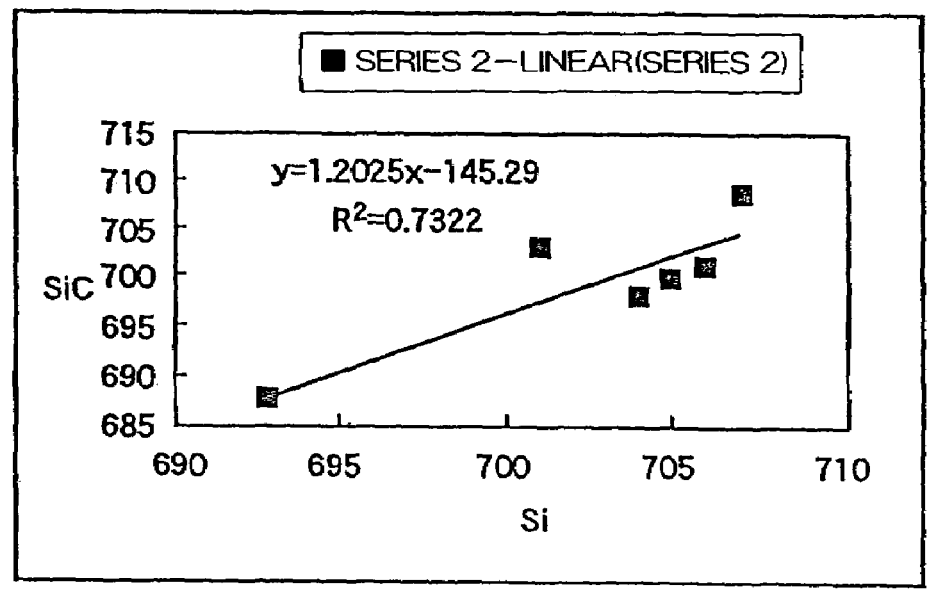
FIG. 5 is a graph showing monitor applicability test results when an Si wafer and an SiC wafer are deposited with polycrystalline silicon in a thin film (about 790 Å)

FIG. 2 is a plotted graph showing measured film thickness of No. 1 taking the Si wafer on the horizontal axis and the SiC wafer on the vertical axis. Its approximation degree is 0.9998, and the graph clearly shows that an SiC wafer can be used as a film thickness measuring monitor wafer. FIG. 3 to FIG. 5 are graphs prepared for each film thickness.

An experimental example of studying the surface roughness and the film thickness measurement limit of the monitor wafer is shown next.

EXAMPLE 2

Figure 6:
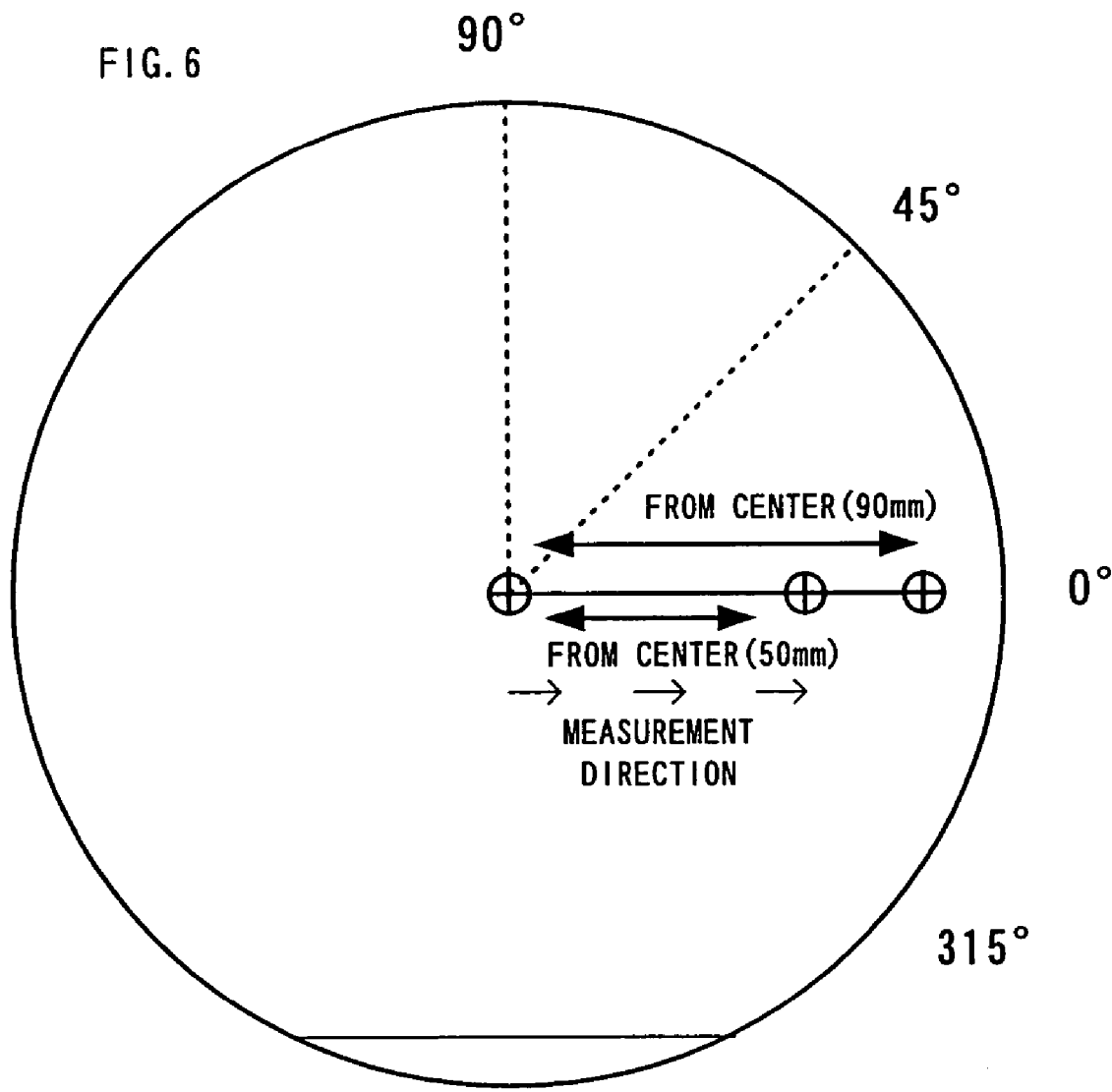
FIG. 6 is a view explaining a measuring method of surface roughness of an SiC wafer.

An 8-inch CVD-SiC black mirror surface wafer is used as a film thickness monitor wafer, and a Poly-Si film is deposited on it and on a product Si wafer together. In this monitor wafer, thought a film thickness at the central portion on the mirror-surface side (front surface) can be measured, a film thickness of the outer peripheries of the mirror-surface side and the matte finish surface (rear surface) cannot be measured. The surface roughness of the monitor wafers in the slit Nos. 1, 3, 5, 7 of the wafer carrier case are measured. FIG. 6 is a view explaining the method of measuring the surface roughness of a monitor wafer. The measurement is carried out in such a manner that an orienteering flat portion is put toward downside, and the portions at the center in the radial direction of the wafer, 50 mm from the center, and 90 mm from the center are measured in the circumferential direction at intervals of 45-degree pitch. The measurement is performed on both sides of front face and back face, taking the mirror-face side as the front face. For the measurement of the surface roughness, a contact-type surface roughness meter SURFCOM 120A manufactured by TOKYO SEIMITSU CO., LTD is used. The measurement result is shown in the following table.

TABLE 3

| | | unit: μm | | | | | | |
|---|---|---|---|---|---|---|---|---|
| | | Slit No. | | | | | | |
| | | 1 | | 3 | | 5 | | 7 |
| | Angle | Front | Back | Front | Back | Front | Back | Front | Back |
| Center | | 0.06 | 0.10 | 0.08 | 0.10 | 0.06 | 0.10 | 0.08 | 0.10 |
| 50 mm from center | 0 degree | 0.08 | 0.10 | 0.04 | 0.10 | 0.06 | 0.10 | 0.10 | 0.12 |
| | 45 degree | 0.08 | 0.10 | 0.10 | 0.10 | 0.06 | 0.12 | 0.08 | 0.10 |
| | 90 degree | 0.06 | 0.10 | 0.08 | 0.10 | 0.06 | 0.10 | 0.08 | 0.12 |
| | 135 degree | 0.08 | 0.10 | 0.08 | 0.10 | 0.06 | 0.10 | 0.08 | 0.10 |
| | 180 degree | 0.08 | 0.10 | 0.08 | 0.10 | 0.06 | 0.10 | 0.08 | 0.10 |
| | 225 degree | 0.06 | 0.10 | 0.06 | 0.10 | 0.06 | 0.10 | 0.10 | 0.10 |
| | 270 degree | 0.08 | 0.12 | 0.06 | 0.10 | 0.06 | 0.10 | 0.08 | 0.10 |
| | 315 degree | 0.08 | 0.10 | 0.06 | 0.10 | 0.06 | 0.10 | 0.08 | 0.10 |
| | average | 0.08 | 0.10 | 0.07 | 0.10 | 0.06 | 0.10 | 0.09 | 0.11 |
| 90 mm from center | 0 degree | 0.10 | 0.10 | 0.08 | 0.10 | 0.06 | 0.14 | 0.10 | 0.14 |
| | 45 degree | 0.08 | 0.10 | 0.08 | 0.10 | 0.08 | 0.12 | 0.08 | 0.12 |
| | 90 degree | 0.08 | 0.10 | 0.06 | 0.10 | 0.06 | 0.10 | 0.10 | 0.12 |
| | 135 degree | 0.10 | 0.10 | 0.08 | 0.10 | 0.06 | 0.10 | 0.08 | 0.10 |
| | 180 degree | 0.08 | 0.10 | 0.06 | 0.10 | 0.10 | 0.10 | 0.08 | 0.10 |
| | 225 degree | 0.08 | 0.10 | 0.08 | 0.10 | 0.10 | 0.12 | 0.10 | 0.12 |

TABLE 3-continued unit: μm

| Angle | Slit No. 1 | | Slit No. 3 | | Slit No. 5 | | Slit No. 7 | |
|---|---|---|---|---|---|---|---|---|
| | Front | Back | Front | Back | Front | Back | Front | Back |
| 270 degree | 0.08 | 0.10 | 0.08 | 0.10 | 0.10 | 0.10 | 0.10 | 0.12 |
| 315 degree | 0.10 | 0.10 | 0.08 | 0.08 | 0.10 | 0.10 | 0.08 | 0.12 |
| average | 0.09 | 0.10 | 0.08 | 0.10 | 0.08 | 0.11 | 0.09 | 0.12 |

Figure 7:
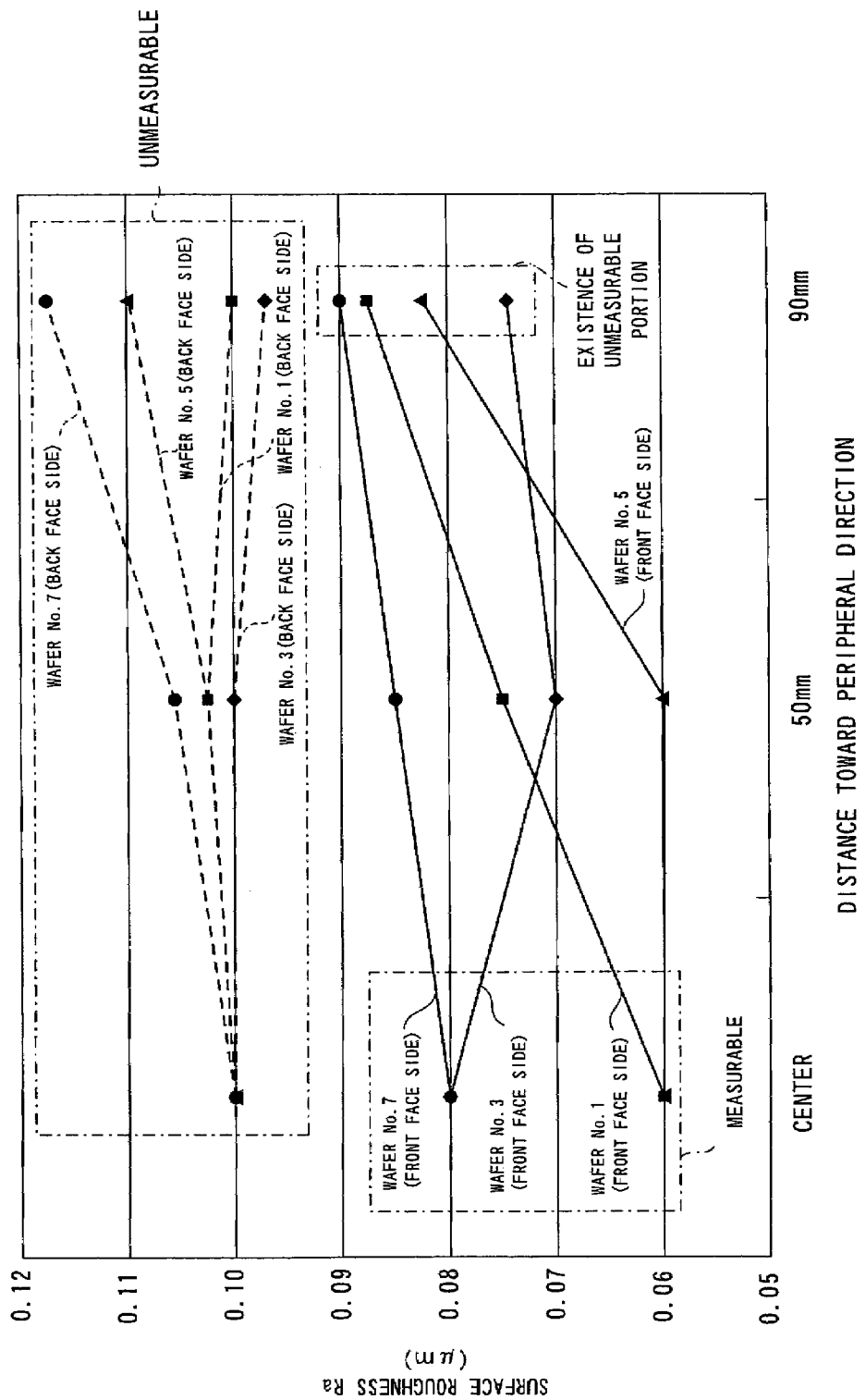
FIG. 7 is a graph showing an actual measurement result of the surface roughness of an SiC wafer.

The above-described measurement result is shown in FIG. 7 in a graph.

In FIG. 7, a solid line indicates the front face side, and a broken line indicates the back face side. From this figure, it is found that the front face side is smaller in surface roughness than that of the back face side, and the surface roughness is getting larger from the center of the wafer toward the outer periphery as a whole. It is turned out that the central portion on the front side where the film thickness was measurable is smaller in surface roughness than other portions, the film thickness is measurable on a portion having a value equal to or smaller than surface roughness Ra=0.08 μm, which is the surface roughness value for the central portion, and when the surface roughness is larger than Ra=0.08 μm, the measurement is unstable, and further when Ra=0.1 μm or more, it was unmeasurable.

It should be noted that though the example of using SiC as a material for a film thickness measuring monitor wafer in the above-described embodiment is explained, this method can be applied to a hard wafer made of, not only SiC, but also alumina, quartz, tungsten, molybdenum, further glassy carbon and sapphire and so on.

As described above, since the film thickness measuring monitor wafer relating to the present invention has a structure that the average surface roughness Ra of at least one surface of a wafer is set to be substantially eqivalent to the film thickness to be deposited on an Si wafer to be measured, it can be used practically as a film thickness monitor wafer without polishing the hard film thickness measuring wafer having chemical resistance to a degree of a product Si wafer, so that it has an effect of providing a film thickness measuring monitor wafer which can reduce the polishing cost and can be used semi-permanently.

INDUSTRIAL AVAILABILITY

The monitor wafer relating to the present invention can be applied to a deposition processing of a wafer in a semiconductor manufacturing process.

The invention claimed is:

1. A film thickness measuring monitor wafer, comprising:
a wafer having an average surface roughness Ra of at least one surface of the wafer, wherein the average surface roughness Ra is substantially equivalent to a film thickness of a film deposited on an Si wafer to be measured.

2. A film thickness measuring monitor wafer, comprising:
a wafer having an average surface roughness Ra of at least one surface of the wafer, wherein the average surface roughness Ra is less than an upper limit value when the minimum film thickness among several types of films deposited on an Si wafer to be measured is taken as the upper limit value.

3. A film thickness measuring monitor wafer, comprising:
a wafer having an upper limit value of the average film roughness of at least one surface of the monitor wafer, wherein the average surface roughness Ra is about 400 times as much as the average surface roughness of a product Si wafer.

4. The film thickness measuring monitor wafer according to claim 3, wherein the average film roughness of said wafer is set to be 0.08 μm or less, more preferably 0.02 μm or less.

* * * * *